United States Patent
Nishihara et al.

(10) Patent No.: US 6,734,763 B2
(45) Date of Patent: May 11, 2004

(54) THIN-FILM PIEZOELECTRIC RESONATOR, BAND-PASS FILTER AND METHOD OF MAKING THIN-FILM PIEZOELECTRIC RESONATOR

(75) Inventors: Tokihiro Nishihara, Kawasaki (JP); Takeshi Sakashita, Kawasaki (JP); Rei Kimachi, Kawasaki (JP); Tsuyoshi Yokoyama, Kawasaki (JP); Tsutomu Miyashita, Kawasaki (JP)

(73) Assignees: Fujitsu Limited, Kawasaki (JP); Fujitsu Media Devices Limited, Suzaka (JP)

( * ) Notice: Subject to any disclaimer, the term of this patent is extended or adjusted under 35 U.S.C. 154(b) by 0 days.

(21) Appl. No.: 10/117,219

(22) Filed: Apr. 8, 2002

(65) Prior Publication Data

US 2003/0107456 A1 Jun. 12, 2003

(30) Foreign Application Priority Data

Oct. 26, 2001 (JP) ........................ 2001-329308
Jan. 23, 2002 (JP) ........................ 2002-013984

(51) Int. Cl.⁷ ............................... H03H 9/00
(52) U.S. Cl. .................. 333/187; 333/188; 29/25.35
(58) Field of Search ............... 333/187–192; 29/25.35

(56) References Cited

U.S. PATENT DOCUMENTS

| | | | |
|---|---|---|---|
| 4,642,508 A | 2/1987 | Suzuki et al. | |
| 5,281,935 A | * 1/1994 | Knecht et al. | 333/187 |
| 5,587,620 A | 12/1996 | Ruby et al. | |
| 6,060,818 A | 5/2000 | Ruby et al. | |

FOREIGN PATENT DOCUMENTS

| | | |
|---|---|---|
| JP | 60-189307 | 9/1985 |
| JP | 2000-69594 | 3/2000 |

* cited by examiner

*Primary Examiner*—Kenneth B. Wells
(74) *Attorney, Agent, or Firm*—Armstrong, Kratz, Quintos, Hanson & Brooks, LLP

(57) ABSTRACT

A thin-film piezo-resonator includes a silicon substrate and a resonator assembly. The substrate is formed with a cavity or through-hole which is opened in the upper and the lower surfaces of the substrate. The resonator assembly, disposed at a location corresponding to the cavity, is composed of a first electrode contacting the upper surface of the substrate, a piezoelectric layer formed on the first electrode and a second electrode formed on the piezoelectric layer. The cavity has a side surface extending in a substantially perpendicular direction to the first surface.

26 Claims, 16 Drawing Sheets

THIN-FILM PIEZOELECTRIC RESONATOR, BAND-PASS FILTER AND METHOD OF MAKING THIN-FILM PIEZOELECTRIC RESONATOR

BACKGROUND OF THE INVENTION

1. Field of the Invention

The present invention relates to a thin-film piezoelectric resonator and a method of making the same. The present invention also relates to a band-pass filter utilizing a thin-film piezoelectric resonator (called "piezo-resonator" below).

2. Description of the Related Art

With the rapid spread of mobile telecommunications equipment such as portable telephones, small and light band-pass filters, as well as resonators needed to make such filters, are in great demand. As known in the art, thin-film piezo-resonators are suitable for producing high-power filters.

A typical thin-film piezo-resonator includes a substrate and a resonator assembly mounted on the substrate. The resonator assembly includes a piezoelectric film and a pair of thin electrodes sandwiching the piezoelectric film from above and below. The substrate is formed with a cavity below the lower electrode of the resonator assembly.

When an AC voltage is applied to the upper and the lower electrode of the piezo-resonator, the sandwiched piezoelectric film vibrates in its thickness direction (which is known as the inverse piezoelectric effect). On the other hand, by the direct piezoelectric effect, a mechanical vibration or elastic wave is converted into a corresponding electrical signal. The elastic wave is a longitudinal wave whose main displacement occurs in the thickness direction of the piezoelectric film. In such a thin-film piezo-resonator, the resonator assembly resonates when its thickness H is equal to n/2 times the wavelength of the elastic wave (where n is an integer). Supposing that the propagation velocity of the elastic wave is V (which depends on the material used), the resonance frequency F is expressed by a formula F=nV/2H. This means that a piezo-resonator having desired frequency characteristics can be obtained by adjusting the thickness H of the resonator assembly. Further, by connecting such resonators in a ladder configuration, it is possible to produce a band-pass filter which allows only those electric waves lying within a certain frequency range to pass.

In the above-described thin-film piezo-resonator, desired resonance characteristics are attained by providing a cavity or hole below the lower electrode. Techniques suitable to making such a cavity are disclosed in "ZnO/SiO$_2$-DIAPHRAGM COMPOSITE RESONATOR ON A SILICON WAFER" (K. NAKAMURA, ELECTRONICS LETTERS Jul. 9, 1981 Vol. 17 No. 14 p507–509), JP-A-60 (1985)-189307, JP-A-2000-69594, U.S. Pat. No. 6,060,818 and U.S. Pat. No. 5,587,620 for example.

FIG. 20 shows, in section, a thin-film piezo-resonator disclosed in the above-mentioned "ZnO/SiO$_2$— DIAPHRAGM COMPOSITE RESONATOR ON A SILICON WAFER". The thin-film piezo-resonator (generally indicated by reference numeral 700) includes a (100)-cut silicon substrate 710 and a resonator assembly 720 supported by the substrate 710. The resonator assembly 720 is made up of a lower electrode 721, a piezoelectric film 722, and an upper electrode 723. The silicon substrate 710 has an upper surface upon which a SiO$_2$ film 711 is formed by thermal oxidation.

The resonator assembly 720 is placed directly on the SiO$_2$ film 711. The silicon substrate 710 is formed with a cavity 710a whose upper opening is closed by the SiO$_2$ film 711. The cavity 710a can be produced by anisotropic etching with respect to the (100) surface of the silicon substrate. The anisotropic etching is performed from below the silicon substrate 710 with the use of KOH solution or EDP solution (ethylenediamine+pyrocatechol+water) for example.

The above anisotropic etching relies upon the fact that the etching rate with respect to the (100) surface of the substrate 710 is significantly greater than the etching rate with respect to the (111) surface. Therefore, the resonator assembly is to be provided only on the (100) surface of the substrate 710. However, such positional limitation is disadvantageous since it restricts the option of the material suitable for making the components of the resonator assembly 720, while also depriving the resonator assembly components of freedom of orientation. Another disadvantage is that the lower opening of the cavity 710a tends to be unduly large due to the nonupright side wall 710a' of the cavity 710a. In the illustrated arrangement, the side wall 710a' corresponds to the (111) surface of the substrate 710 and has an inclination of 54.7 degrees with respect to the (100) surface of the silicon substrate 710. Due to this, the cavity 710a has a large opening in the bottom surface of the silicon substrate 710. For instance, when the substrate 710 has a thickness of 300 μm, the lower opening of the cavity 710a is larger than the upper opening by more than 420 μm. Unfavorably, such a large opening of the cavity 710a reduces the mechanical strength of the piezo-resonator 700. In addition, it contributes to an increase in the overall size of the piezo-resonator 700. With the use of such oversize piezo-resonators, a compact band-pass filter cannot be obtained. Specifically, when the thickness of the substrate 710 is 300 μm, the lower opening of the cavity 710a is larger than the upper opening by more than 420 μm, as noted above. Thus, the distance between the neighboring upper openings should be more than 420 μm. Further, as the distance between the adjacent upper openings increases, the length of the wiring pattern for connecting the adjacent resonator assemblies should also increase. This leads to an increase in the resistance of the wiring pattern. A greater resistance of the wiring pattern can be a major factor that prevents the improvement of the filter characteristics in a high-frequency band.

FIG. 21 shows a thin-film piezo-resonator disclosed in JP-A-60-189307. The piezo-resonator 800 includes a substrate 810, and a resonator assembly 820 which is made up of a lower electrode 821, a piezoelectric film 822, and an upper electrode 823. A cavity 830 is provided between the substrate 810 and the resonator assembly 820. According to the Japanese document, the piezo-resonator 800 is fabricated in the following manner. First, a sacrifice layer for the cavity 830 is formed in a pattern on the substrate 810. Next, a SiO$_2$ film 840 is formed on the sacrifice layer 840 in a manner such that part of the sacrifice layer is exposed. Then, the resonator assembly 820 is provided on the SiO$_2$ film 840. Finally, the sacrifice layer is removed by wet etching, so that the cavity 830 appears below the resonator assembly 820. According to this method, the cavity 830 is kept from becoming too large with respect to the resonator assembly 820.

In the thin-film piezo-resonator utilizing a longitudinal vibration in the thickness direction, a high-orientation piezoelectric film is required to provide excellent resonance characteristics. According to the technique disclosed in JP-A-60-189303, however, it is difficult to give a sufficiently high orientation to the piezoelectric film 822. The cavity 830 below the resonator assembly 820 has a length L15, which needs to be at least a few micron meters when a twist and oscillation displacement of the resonator assembly 820 are taken into consideration. Unfavorably, the sacrifice layer, formed to have a thickness corresponding to the length L15, has a greater surface roughness than that of the silicon substrate 810. This deteriorates the orientation of the lower electrode 821 and the piezoelectric film 822 both of which are grown on the sacrifice layer via the $SiO_2$ film 840. As a result, it is difficult to obtain good resonance characteristics with the thin-film piezo-resonator.

FIG. 22 is a sectional view of a thin-film piezo-resonator disclosed in JP-A-2000-69594. The thin-film piezo-resonator 900 includes a silicon substrate 910, and a resonator assembly 920 made up of a lower electrode 921, a piezoelectric film 922 and an upper electrode 923. A cavity 910a is provided below the resonator assembly 920. According to this document, to make the thin-film piezo-resonator 900, the silicon substrate 910 is etched to form a recess serving as the cavity 910a. Then, a $SiO_2$ film 930 is formed by thermal oxidation on a surface of the silicon substrate 910. Next, material is deposited in the cavity 910a to form a sacrifice layer. After the depositing, the surface of the sacrifice layer is polished and cleaned. Next, the resonator assembly 920 is formed on the sacrifice layer in a manner such that the sacrifice layer is partially exposed. Finally, the sacrifice layer is removed by wet etching.

However, the method disclosed in JP-A-2000-69594 includes a large number of steps such as the step of depositing the sacrifice layer in the cavity 910a, the step of polishing the sacrifice layer and so on. Therefore, it is difficult to manufacture the thin-film piezo-resonator at a low cost and at a high yield.

SUMMARY OF THE INVENTION

The present invention has been proposed under the circumstances described above. It is, therefore, an object of the present invention to solve or reduce the above conventional problems, and to provide a thin-film piezo-resonator suitable for miniaturization and having a highly oriented piezoelectric film, to provide a band-pass filter including this thin-film piezo-resonator, and to provide a method of making such a thin-film piezo-resonator.

According to a first aspect of the present invention, there is provided a thin-film piezo-resonator comprising: a substrate having a first surface and a second surface opposite to the first surface, the substrate being formed with a cavity that has a first opening in the first surface and a second opening in the second surface; and a resonator assembly including an exciter composed of a first electrode contacting the first surface, a piezoelectric layer on the first electrode and a second electrode on the piezoelectric layer, the assembly being disposed at a location corresponding to the cavity. The cavity includes a side surface extending in a substantially perpendicular direction to the first surface of the substrate.

In this specification, the "exciter" refers to the overlapping region of the first and the second electrodes (or electrode patterns) and the piezoelectric layer.

With the above arrangements, it is possible to fabricate a thin-film piezoelectric resonator that is compact and exhibits excellent resonance characteristics. The compactness results from the cavity that penetrates the substrate in a non-flaring manner, with an uniformly upright side surface. Such a cavity may be produced by dry etching such as Deep-RIE (Reactive Ion Etching), regardless of the cut condition of the substrate. With the use of such compact resonators, a compact filter can be obtained. Further, since the cut condition of the substrate does not affect the formation of the cavity, the most suitable cut surface can be realized in the substrate. The free selectability of the cut surface facilitates the forming of a highly oriented first electrode (lower electrode) thereon. This allows a highly oriented piezoelectric layer to be formed on the first electrode. Accordingly, it is possible to produce a thin-film piezo-resonator with excellent resonance characteristics.

The first electrode and the second electrode may be formed of e.g. aluminum (Al), copper (Cu), molybdenum (Mo), chromium (Cr), titanium (Ti) and platinum (Pt). The piezoelectric layer may be formed of e.g. aluminum nitride (AlN), zinc oxide (ZnO), lead zirconate titanate (PZT), and lead titanate ($PbTi_3$). The substrate may be made of silicon.

Preferably, the first electrode may include a uniaxially oriented single-layer conductive member or uniaxially oriented multi-layer conductive member. In addition, the piezoelectric layer may also be uniaxially oriented. Preferably, the substrate may be a (111)-cut silicon substrate, so that its first and second surfaces are a (111) surface. These arrangements are preferable in providing a highly oriented piezoelectric layer.

Preferably, the first electrode may include a single conductive layer containing either one of (111)-uniaxially oriented Al and (111)-uniaxially oriented Cu. Or, the first electrode may include a stack of uniaxially oriented conductive layers including a first conductive layer held in contact with said first surface, the first conductive layer containing either one of (111)-uniaxially oriented Al and (111)-uniaxially oriented Cu. Or, the first electrode may have a two-layer structure including a first conductive layer and a second conductive layer, where the first conductive layer, held in contact with the first surface of the substrate, contains either one of (111)-uniaxially oriented Al and (111)-uniaxially oriented Cu, while the second conductive layer contains (110)-uniaxially oriented Mo.

With the above arrangement, it is possible to form a highly oriented first electrode on the (111)-cut silicon substrate.

Preferably, the piezoelectric layer may be made of either one of (002)-uniaxially oriented AlN and (002)-uniaxially oriented ZnO for high orientation.

Preferably, the resonator of the present invention may further include a cover substrate for protection of e.g. the resonator assembly. The cover substrate may be bonded to the second surface of the substrate so as to close the cavity.

Preferably, the first electrode and the piezoelectric layer may each include a portion exposed to the cavity. Such exposure is advantageous to providing the resonator with excellent resonance characteristics.

According to a second aspect of the present invention, there is provided a thin-film piezo-resonator that includes: a (111)-cut silicon substrate; a first electrode formed on the substrate and containing either one of Al and Cu; a piezoelectric layer formed on the first electrode and containing either one of AlN and ZnO; and a second electrode formed on the piezoelectric layer. The silicon substrate includes a first surface which is a (111) surface. The first electrode is held in contact with the first surface of the substrate.

According to a third aspect of the present invention, there is provided a thin-film piezo-resonator that includes: a substrate having a first surface and a second surface opposite to the first surface, the substrate being formed with a cavity that has a first opening in the first surface of the substrate; and a resonator assembly including a first electrode contacting the first surface of the substrate, a piezoelectric layer on the first electrode and a second electrode on the piezoelectric layer. The resonator assembly is disposed at a location corresponding to the cavity. Each of the first electrode and the piezoelectric layer includes a portion exposed to the cavity.

With the above arrangements, the resonator assembly exhibits better resonance characteristics than when it is isolated from the cavity. Further, when the opening of the cavity is wide enough to allow not only the first electrode but also the piezoelectric layer to be exposed, resonance characteristics such as the minimum insertion loss or attenuation pole suppression can be improved.

According to a fourth aspect of the present invention, there is provided a filter that includes: a substrate having a first surface and a second surface opposite to the first surface, where the substrate is formed with a plurality of cavities spaced from each other; a first electrode pattern held in contact with the first surface of the substrate; a piezoelectric layer on the first electrode pattern; a second electrode pattern on the piezoelectric layer; and a plurality of resonator assemblies provided by a combination of the first electrode pattern, the piezoelectric layer and the second electrode pattern, where each of the resonator assemblies corresponds in position to one of the cavities. Each of the cavities has a side surface extending in a substantially perpendicular direction to the first surface of the substrate.

Preferably, each of the cavities may include a first opening in the first surface of the substrate and a second opening in the second surface of the substrate, where the distance between adjoining first openings is no greater than 420 $\mu$m.

With the above arrangement, it is possible to provide a compact filter. Further, since the connecting distance between any adjoining resonator assemblies can be short, the resistance of the wiring pattern is also reducible. Advantageously, a filter with a less resistive wiring pattern exhibits better performance in a high-frequency band.

In a conventional filter which includes a silicon substrate formed with several cavities (each corresponding in position to one of the piezoelectric resonators), the upper openings of adjoining cavities should be spaced from each other by more than 420 $\mu$m (supposing that the thickness of the substrate is 300 $\mu$m or more) due to the downward flare of the cavities (see FIG. 20). According to the present invention, on the other hand, the distance between adjoining first or upper openings is 420 $\mu$m or smaller by forming each cavity in a manner such that its side surface extends perpendicularly to the substrate. As a result, the filter of the present invention can be smaller than a conventional filter.

Preferably, the resonator assemblies used for the filter of the present invention may include a first group of resonator assemblies connected in series and a second group of resonator assemblies connected in parallel. This makes the filter a ladder type.

Preferably, the first electrode pattern and the piezoelectric layer may be exposed to one of the cavities.

According to a fifth aspect of the present invention, there is provided a filter that includes: a substrate that has a first surface and a second surface opposite to the first surface and is formed with a plurality of cavities each including a first opening in the first surface of the substrate and a second opening in the second surface of the substrate; a first electrode pattern held in contact with the first surface of the substrate; a piezoelectric layer on the first electrode pattern; a second electrode pattern on the piezoelectric layer; and a plurality of exciters provided by the combination of the first electrode pattern, the piezoelectric layer and the second electrode pattern, where each of the exciters corresponds in position to one of the cavities. The first electrode pattern and the piezoelectric layer each include a portion exposed to one of the cavities.

In the above-mentioned aspects of the present invention, the first and the second openings of the cavity may preferably be circular or oval rather than rectangular. This is because a rectangular opening is more difficult to make than a smoothly curved opening by dry-etching, since the etching rate for the corners of the opening tends to be slower than the etching rate for the other portions. In particular, when several openings of different sizes are to be made in a single substrate, the production efficiency is significantly higher in making arcuate openings than in making rectangular openings.

As noted above, the first electrode or the piezoelectric layer may have a portion exposed to a cavity for better resonance characteristics. Preferably, these exposed portions may be made of a material which is not etched by a fluorine gas. Examples of such material are aluminum and copper. With this arrangement, the first electrode and the piezoelectric layer will not or hardly be damaged in performing Deep-RIE.

In this specification, as defined above, an "exciter" is the overlapping region of the first and the second electrodes (or electrode patterns) and the piezoelectric layer. More specifically, the first electrode includes a "first exciter portion" that overlaps the second electrode. Likewise, the second electrode includes a "second exciter portion" that overlaps the first electrode. In symmetry, the first and the second exciter portions have the same or substantially same configuration. The exciter is the assembly of the first and the second exciter portions and a portion of the piezoelectric layer that is sandwiched between the first and the second exciter portions. Since the first and the second exciter portions are (substantially) the same in shape, the desired capacitance is precisely attained between the first and the second exciter portions. Preferably, each exciter portion as a whole or in part may be circular or oval.

In the first to fifth aspects of the present invention, the area of the first opening of a cavity may preferably be 1~2.25 times larger than the area of the above-defined first or second exciter portion. With this design, the resonator assembly can exhibit good resonance characteristics, while being prevented from suffering deformation or damage.

According to a sixth aspect of the present invention, there is provided a method of making a thin-film piezo-resonator. The method includes the steps of: preparing a substrate including a first surface and a second surface opposite to the first surface; forming a resonator assembly which includes a first electrode held in contact with the first surface of the substrate, a piezoelectric layer formed on the first electrode and a second electrode formed on the piezoelectric layer; and forming a cavity by dry-etching the substrate, where the cavity is disposed at a location corresponding to the resonator assembly, and opened in the first and the second surfaces of the substrate. The cavity includes a side surface extending in a substantially perpendicular direction to the first surface of the substrate.

According to a seventh aspect of the present invention, there is provided a method of making a thin-film piezoresonator. The method includes the steps of: preparing a substrate including a first surface and a second surface opposite to the first surface; forming a resonator assembly which includes a first electrode held in contact with the first surface of the substrate, a piezoelectric layer formed on the first electrode and a second electrode formed on the piezoelectric layer; and forming a cavity by dry-etching the substrate, where the cavity is disposed at a location corresponding to the resonator assembly, and opened in the first and second surfaces of the substrate. The first electrode and the piezoelectric layer are caused to be partially exposed to the cavity at the cavity-forming step.

In the sixth and the seventh aspects of the present invention, the dry etching may be Deep-RIE. The method may further include the step of bonding a cover substrate to the second surface of the substrate so as to close the cavity. In the method, a groove for dividing the substrate may also be formed by etching at the cavity-forming step.

Other features and advantages of the present invention will become apparent from the detailed description given below with reference to the accompanying drawings.

DETAILED DESCRIPTION OF THE PREFERRED EMBODIMENT

The preferred embodiments of the present invention will be described below with reference to the accompanying drawings.

Figure 1:
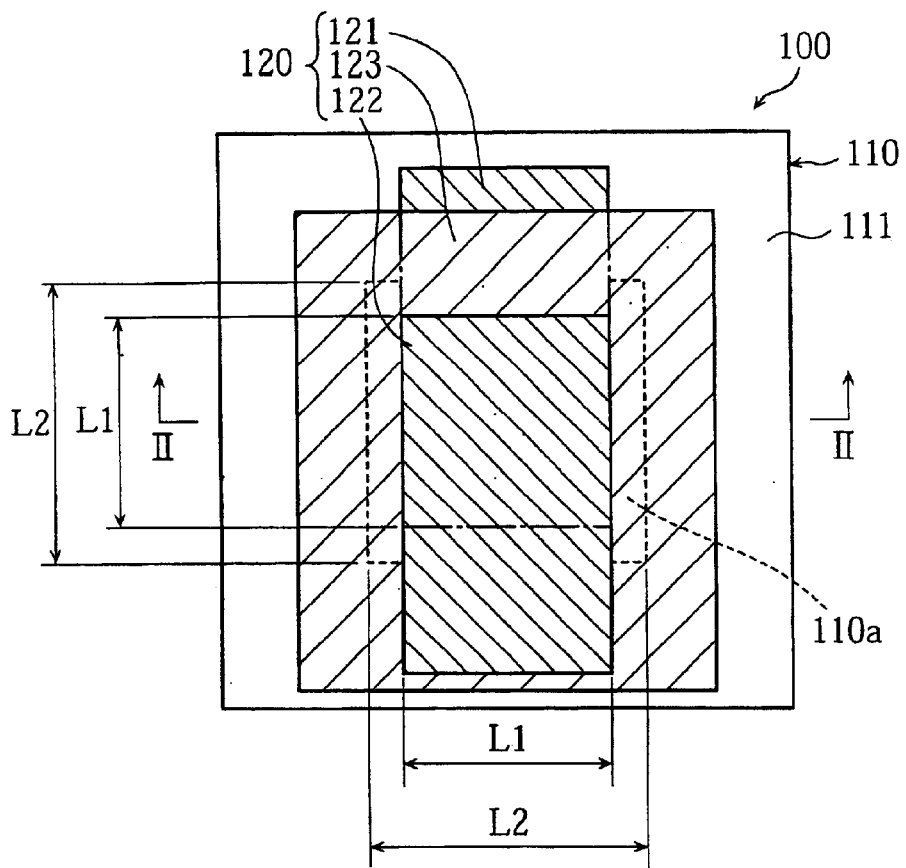
FIG. 1 shows a thin-film piezo-resonator according to a first embodiment of the present invention.
Figure 2:
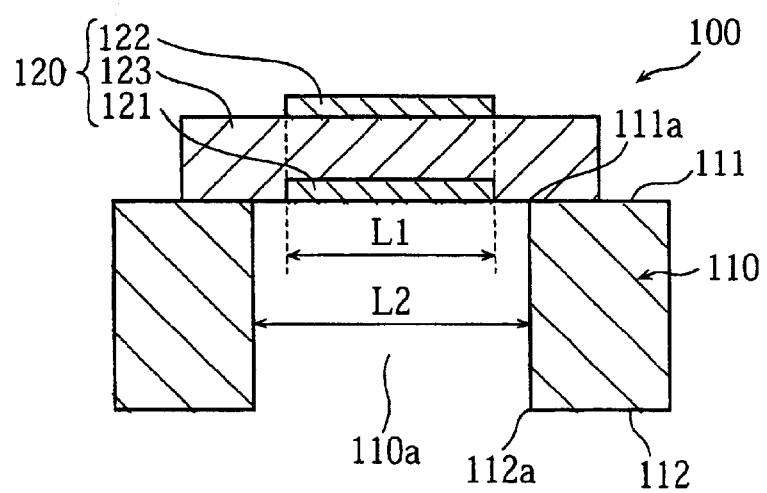
FIG. 2 is a sectional view taken in lines II—II in FIG. 1.

FIG. 1 shows a thin-film piezo-resonator 100 according to a first embodiment of the present invention. FIG. 2 is a sectional view taken along lines II—II in FIG. 1.

The thin-film piezo-resonator 100 includes a silicon substrate 110, and a resonator assembly 120 formed thereon. The silicon substrate 110 is a (111)-cut monocrystal silicon substrate, and has a first surface 111 and a second surface 112 each provided as a (111) surface. The resonator assembly 120 includes a first electrode film 121, a second electrode film 122, and a piezoelectric film 123 sandwiched by these films. According to the present embodiment, the first electrode film 121 has a thickness of 100 nm, and is made of (111)-uniaxially oriented Al or Cu. The second electrode film 122 has a thickness of 100 nm, and is made of Al or Cu. The piezoelectric film 123 has a thickness of 500 nm, and is provided by (002)-uniaxially oriented AlN or ZnO.

The silicon substrate 110 is formed with a cavity 110a below the resonator assembly 120. The cavity 110a penetrates the silicon substrate 110 vertically with respect to the first surface 111 and the second surface 112. The cavity 110a has an opening 112a on the second surface 112, which is identical in area and shape to an opening 111a on the first surface 111. In the illustrated example, the openings 111a and 112a are both square. Since the opening 112a of the cavity 110a is not significantly larger than the opening 111a, it is possible to design the silicon substrate 110, and hence the thin-film piezo-resonator 100, to a desirably small size. For example, if the thin-film piezo-resonator 100 is to have a resonance frequency of 5 GHz, the resonator assembly 120 should have an exciter whose length L1 is equal to about 50 μm. The cavity 110a has a length L2 equal to about 60 μm. The "exciter" refers to a region overlapped by the first electrode film 121 and the second electrode film 122 via the piezoelectric film 123. In the illustrated example, the exciter has a square configuration whose side has a length L1. According to the present invention, the exciter may have a rectangular or other configuration. In conformity with the exciter, the openings 111a, 112a may be modified in configuration. In the illustrated example, the first electrode 121 and the piezoelectric film 123 are partially exposed to the cavity 110a. This provides the piezo-resonator 100 with excellent resonance characteristics.

Figure 3:
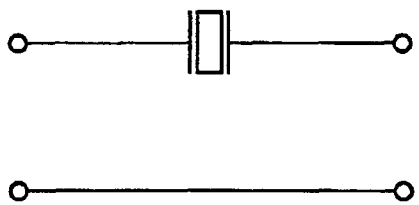
FIG. 3 shows a one-port, thin-film piezo-resonator subjected to a characteristic evaluation measurement.
Figure 4:
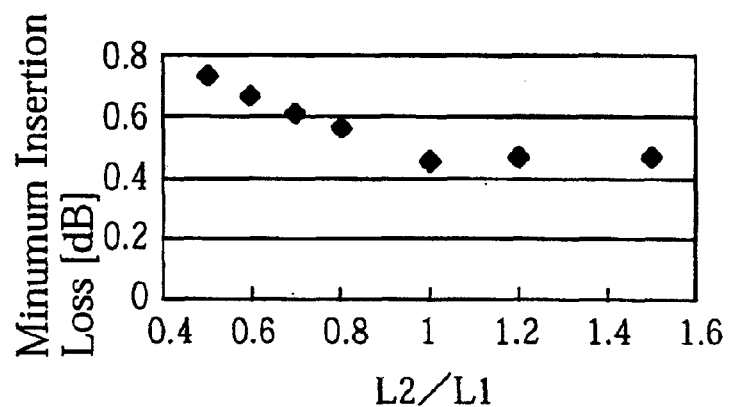
FIG. 4 is a graph showing the dependency of minimum insertion loss on L2/L1.
Figure 5:
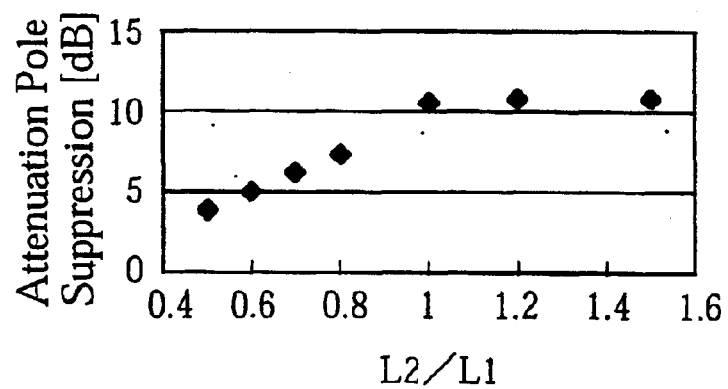
FIG. 5 is a graph showing the dependency of attenuation pole suppression on L2/L1.

Description will now given to the influence of the length L1 (of the exciter) and the length L2 (of the cavity 110a or the opening 111a) on the resonance characteristics. A single-port resonator provided by the thin-film piezo-resonator 100 was connected to a network analyzer, as shown in FIG. 3. The passing characteristics (S21 characteristics) were measured. FIG. 4 and FIG. 5 show the results of the measurement. The thin-film piezo-resonators 100 used for the measurement ware made up of a (111)-cut 300 μm-thick silicon substrate 110, and a resonator assembly 120 which includes a 100 nm-thick first electrode film 121 made of Al, a 500 nm-thick piezoelectric film 123 made of ZnO, and a 100 nm-thick second electrode film 122 made of Al. With the piezo-resonators 100, the ratio of the length L1 to the length L2 is not the same. FIG. 4 is a graph showing the dependency of minimum insertion loss on L2/L1. FIG. 5 is a graph showing the dependency of attenuation pole suppression on L2/L1.

According to the graph in FIG. 4, the minimum insertion loss increases when L2/L1 is smaller than 1, but remains generally constant when L2/L1 is no smaller than 1. According to the graph in FIG. 5, the attenuation pole suppression decreases when L2/L1 is smaller than 1, but remains generally constant when L2/L1 is no smaller than 1. As suggested by the minimum insertion loss and the attenuation pole suppression, the resonance characteristics are excellent when L2/L1 is no smaller than 1. This is because both the first electrode 121 and the piezoelectric film 123 are partially exposed to the cavity 110a when L2/L1 is no smaller than 1 (when L2/L1 is smaller than 1, only the first electrode 121 is exposed to the cavity 110a). However, when L2/L1 is greater than 1.5, the exciter can readily warp. Unfavorably, this may increase the alteration factors of the resonance characteristics and also make the resonator 100 more vulnerable to damage.

Therefore, L2/L1 must be no smaller than 1, but as small as possible in consideration of the accuracy of the manufacturing process. Preferably, L2/L1 should be in a range of 1~1.5.

For the measurements, the exciter has a square configuration whose side is L1 in length, and the opening 111a also has a square configuration whose side is L2 in length. Since the preferable value of the L2/L1 is in a range of 1~1.5, the areal ratio of the opening 111a to the exciter should be in a range of 1~2.25. This holds for a case where neither the opening 111a nor the exciter is square.

Next, description will be given to the influence which the condition of the silicon substrate surface exerts on the orientation of the first electrode film and the piezoelectric film formed on the substrate. For comparison, four substrates A, B, C and D were prepared. The substrate A was a (111)-cut silicon substrate. The substrate B was a (100)-cut silicon substrate. The substrate C was a (111)-cut silicon substrate formed with a 5-micrometer-thick $SiO_2$ film by sputtering. The substrate D was a (100)-cut silicon substrate formed with a 5-micrometer-thick $SiO_2$ film by sputtering. Then, each substrate was formed with a 100 nm-thick Al film as the first electrode film by sputtering. Further, an piezoelectric film of ZnO was formed by sputtering on the first electrode film to have a thickness of 500 $\mu$m. Then, for each substrate, the orientation of the Al and ZnO in the formed film was checked. Specifically, the orientation was evaluated based on the FWHM (Full Width at Half Maximum) value of a rocking curve obtained through X-ray diffraction. A higher FWHM value means a higher orientation. In order to provide good piezoelectric characteristics, the piezoelectric film preferably has an FWHM value smaller than 6 degrees.

Table 1 shows FWHM values of the (111)-uniaxially oriented Al and the (002)-uniaxially oriented ZnO for the Al or ZnO films formed on the substrates A, B, C and D.

TABLE 1

|  | Al | ZnO |
| --- | --- | --- |
| Substrate A | 0.71° | 0.86° |
| Substrate B | 13.2° | 7.4° |
| Substrate C | Nonmeasurable | Nonmeasurable |
| Substrate D | Nonmeasurable | Nonmeasurable |

As shown in Table 1, in the substrate A, the Al showed a good (111) uniaxial orientation, and the ZnO showed a good (002) uniaxial orientation. The "uniaxial orientation" here means that in a result of a $\theta$-$2\theta$ measurement in the X-ray diffraction, diffraction peak intensity from undesired crystal surfaces is not greater than 1/100 of diffraction peak intensity from the desired crystal surface. In the substrate B, relatively strong diffraction peaks were observed from other crystal surfaces such as Al (200) and the ZnO (103), showing that no sufficient uniaxial orientation was realized in the Al-layer as the first electrode and in the ZnO-layer as the piezoelectric film. As shown, the substrate A made by (111) cutting has a smaller FWHM values for Al (111) and ZnO (002) than the substrate B made by (100) cutting, indicating that the orientation is high in both the Al-layer as the first electrode and the ZnO layer as the piezoelectric film. As for the substrates C and D, the $SiO_2$ film formed on the substrate has a very rough surface, so that the orientations in the Al and ZnO films cannot be measured For the substrates A and B, additional orientation checking was performed in the same manner as described above. This time, the substrates A and B were provided with a 100 nm-thick Cu film as the first electrode and with a 500 nm-thick ZnO film as the piezoelectric film. The additional checking revealed that in the substrate A, Cu showed good (111) uniaxial orientation, whereas ZnO showed good (002) uniaxial orientation. In particular, the ZnO film as the piezoelectric film showed a FWHM value of 1.8° in the substrate A and 9.6° in the substrate B. This result indicates that ZnO as the piezoelectric film in the substrate A has a higher orientation than ZnO in the substrate B. Further, another orientation checking was performed for the substrates A and B in which a 50 nm-thick Al and an additional 100 nm-thick Mo film were formed as the first electrode, and a 500 nm-thick AlN film was formed as the piezoelectric film. The results are that in the substrate A, Al showed good (111) uniaxial orientation, Mo showed good (110) uniaxial orientation, and AlN showed good (002) uniaxial orientation. In the substrate B, a diffraction peak from a crystal surface such as Mo (211) was observed in the Mo layer of the first electrode, which reveals that there was not good uniaxial orientation. In particular, the AlN film formed as the piezoelectric film showed a FWHM value of 2.1° for the substrate A, whereas the value was nonmeasurable for the substrate B.

The above result show that the substrates A and B (that is, the silicon substrate formed with no $SiO_2$ film) are more suitable for the formation of oriented piezoelectric film than the substrates C and D which are formed with $SiO_2$ films. Further, it is understood that the substrate A, a (111)-cut silicon substrate, is more suitable for the formation of a highly oriented piezoelectric film than the substrate B, a (100)-cut silicon substrate.

FIGS. 6A~6E and 7A~7D show essential steps in the manufacturing processes of the piezo-resonator 100 shown in FIG. 1. The sectional views shown in these figures are taken along the lines II—II in FIG. 1.

Figure 6A:
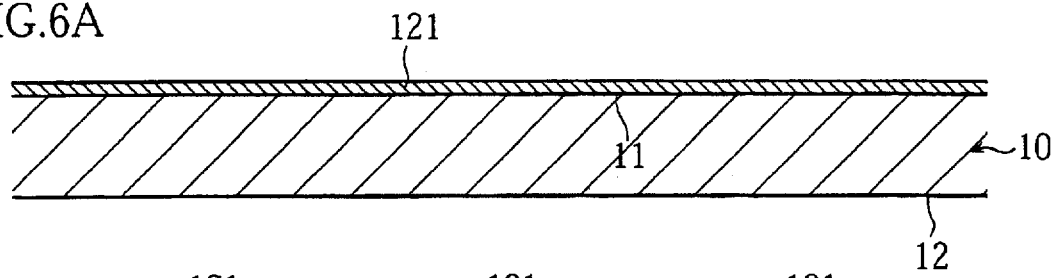
FIGS. 6A–6E show several sequential steps for manufacturing the thin-film piezo-resonator in FIG. 1.
Figure 6B:
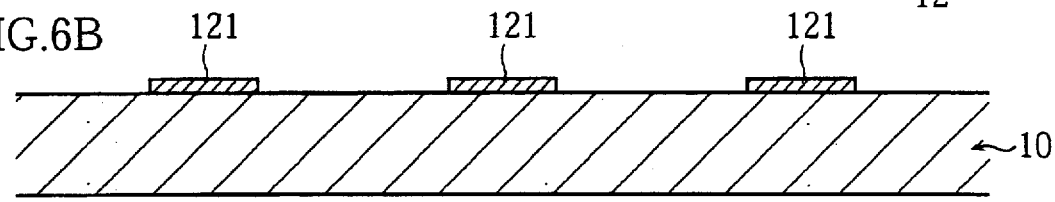

Specifically, as shown in FIG. 6A, a first electrode film 121 is formed on a silicon wafer 10 by sputtering. The thickness of the resultant film 121 is 100 nm. The silicon wafer 10 is a (111)-cut wafer. A first surface 11 and a second surface 12 of the wafer 10 are a (111) surface. The first electrode film is made of Al or Cu. Referring to FIG. 6B, dry etching or wet etching is performed via a patterned resist layer (not shown) to pattern the first electrode film 121. For the dry etching, use may be made of a gas mixture of $BCl_3$ and $Cl_2$ for Al, and a gas mixture of Ar and $Cl_2$ for Cu. In the wet etching, for Al, the etching solution may be a water solution containing phosphoric acid, acetic acid and nitric acid, while for Cu, it may be a water solution of ceric ammonium nitrite. These can be used for the subsequent etching processes.

Figure 6C:
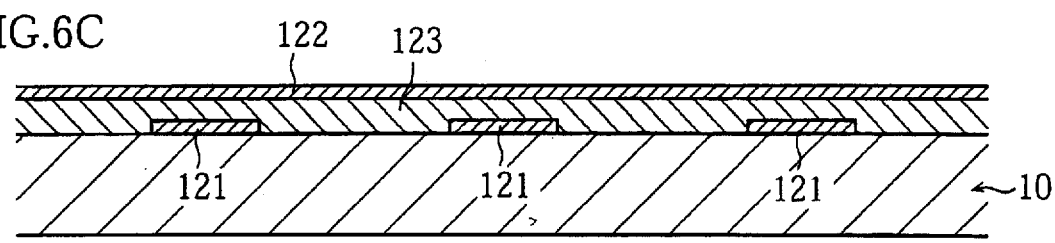
Figure 6D:
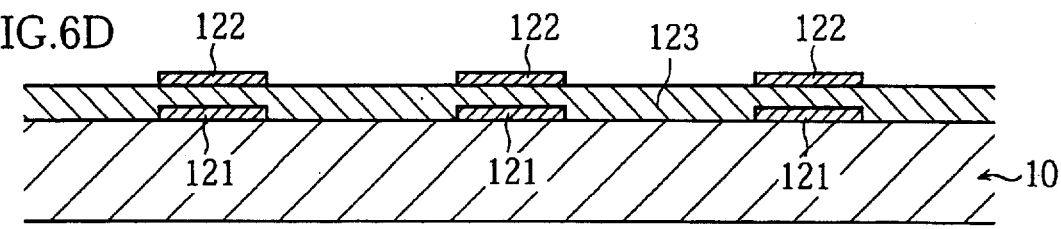
Figure 6E:
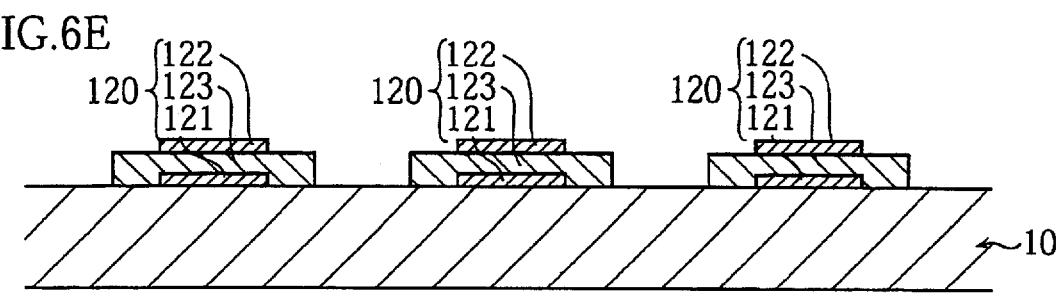

Next, as shown in FIG. 6C, sputtering is performed to form a piezoelectric film 123 to a thickness of 500 $\mu$m, and a second electrode film 122 to a thickness of 100 nm. The piezoelectric film 123 is made of AlN or ZnO. The second electrode film 122 is made of Al or Cu. Next, as shown in FIG. 6D, dry etching or wet etching is performed via a resist pattern, to pattern the second electrode film 122. Next, as shown in FIG. 6E, dry etching or wet etching is performed via a mask, to pattern the piezoelectric film 123. In the wet etching, heated phosphoric acid can be used as the etching solution for AlN, and a water solution of acetic acid can be used for ZnO. The patterning of the piezoelectric film 123 leaves a resonator assembly 120 on each region to be the resonator device.

In the above method, the resonator assembly 120 is produced through a resist film forming step, light exposure to the resist, and etching for the electrode film and the piezoelectric film. According to the present invention, alternatively, the resonator assembly 120 may be produced through a resist film forming step, light exposure to the resist, an electrode/piezoelectric film forming step and a lift-off step.

Figure 7A:
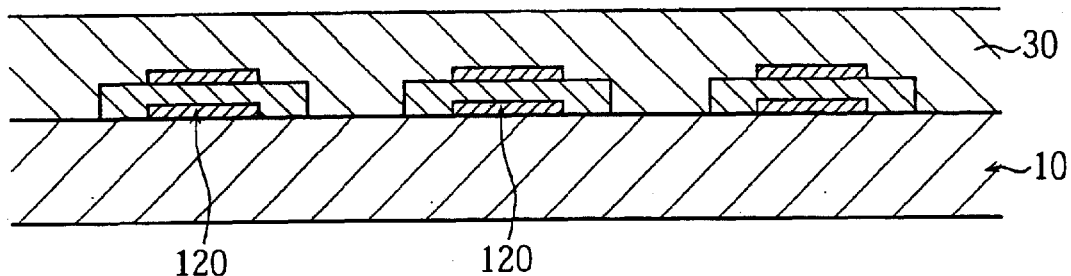
FIGS. 7A–7D show several steps subsequent to the previous steps shown in FIG. 6.

Next, as shown in FIG. 7A, a resist 30 is formed on the first surface 11 of the silicon wafer 10. The resist 30 protects the resonator assembly 120 in the subsequent steps.

Figure 7B:
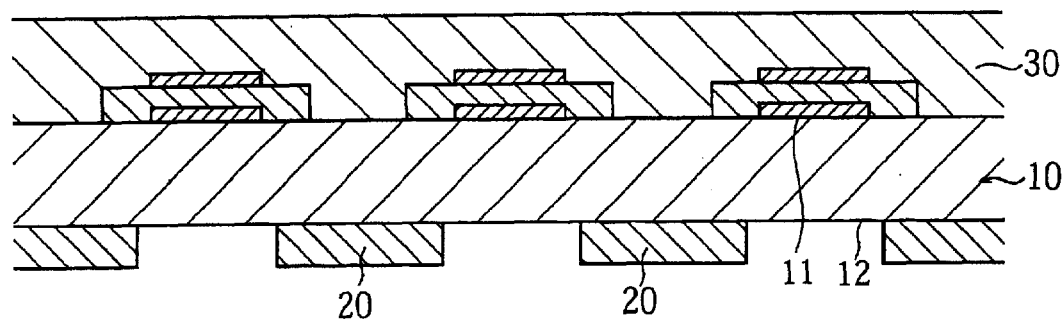

Next, as shown in FIG. 7B, a resist pattern 20 is formed on the silicon wafer 10. Specifically, a photo-resist film is formed on the second surface 12 of the silicon wafer 10. The photo-resist film is then exposed and developed to leave the resist pattern 20.

Figure 7C:
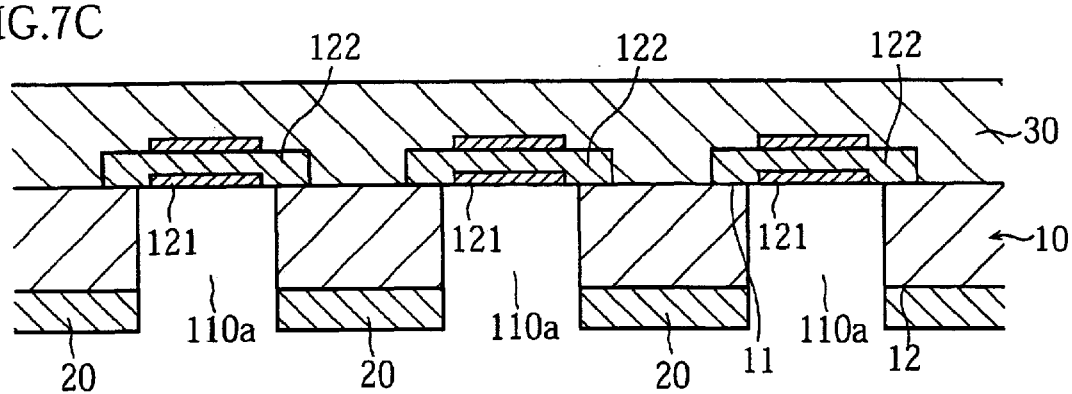

Next, as shown in FIG. 7C, the silicon wafer 10 is subjected to Deep-RIE, which is a dry etching, via the resist pattern 20. This step leaves a cavity 110a in each of the resonator device. In the Deep-RIE, etching and sidewall protection are performed alternately. For instance, etching with $SF_6$ gas is performed for about 10 seconds, to be followed by sidewall protection with $C_4F_8$ gas which is performed for about 10 seconds. The bias applied to the wafer is about 20 W. This forms the cavity 110a that is generally vertical to the first surface 11 and second surface 12 of the silicon wafer 10. In the dry etching with the use of fluoric gas, advantageously, Al, Cu, AlN and ZnO are not etched away. Thus, the cavity 110a can be produced without damaging the first electrode 121 and the piezoelectric film 122. In the dry etching, Al, Cu, AlN and ZnO serve as a stopper for the etching process.

Additionally, according to the present invention, in the step of forming the cavity 110a, split grooves for separating the wafer into device elements may be formed. This eliminates a dicing step otherwise necessary for dividing the wafer, thereby facilitating the manufacturing of the thin-film piezo-resonator 100.

Figure 7D:
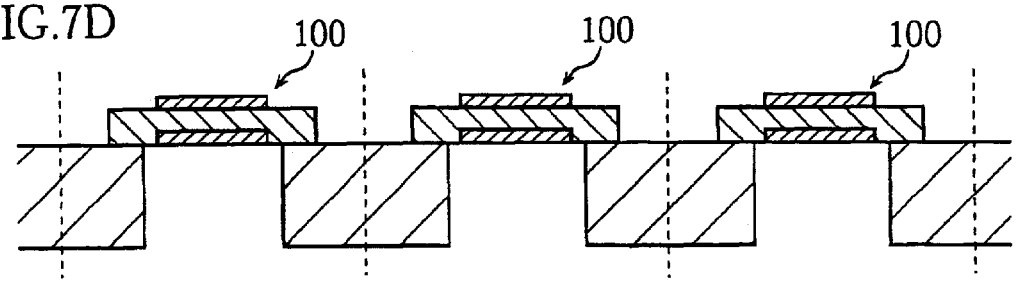

Referring to FIG. 7D, the resist pattern 20 and the resist 30 are removed. Then, through the dicing step, a plurality of thin-film piezo-resonators are obtained.

Figure 8:
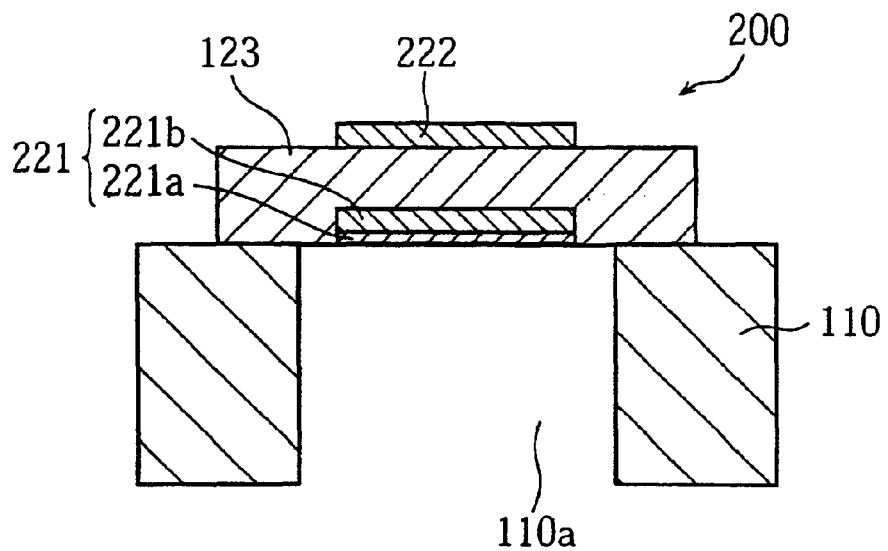
FIG. 8 is a sectional view of a thin-film piezo-resonator according to a second embodiment of the present invention.

FIG. 8 is a sectional view of a thin-film piezo-resonator according to a second embodiment of the present invention. The piezo-resonator 200 includes a first electrode 221 and a second electrode 222. As seen from the figure, the first electrode 221 has a two-fold structure which includes a first conductive layer 221a and a second conductive layer 221b. The first conductive layer 221a has a thickness of 50 nm, and is made of (111)-uniaxially oriented Al or Cu. The second conductive layer 221b has a thickness of 100 nm, and is made of (110)-uniaxially oriented Mo. The second electrode 222 has a thickness of 100 nm, and is made of Mo.

To make the piezo-resonator 200, the step shown in FIG. 6A is replaced by a step in which the first and the second conductive layers 221a, 221b are formed in a stacking manner. Then, in the next step (corresponding to the step shown in FIG. 6B), the first and the second conductive layers 221a, 221b are subjected to patterning together. The wet etching for this patterning and the wet etching for patterning the second electrode 222 may be performed with etchant such as a water solution containing phosphoric acid, acetic acid and nitric acid. Except for the above-mentioned difference, the piezo-resonator 200 of the second embodiment is similar in arrangement to the piezo-resonator 100 of the first embodiment, and therefore can be fabricated in a similar manner.

In the piezo-resonator 200 again, it is possible to form the highly oriented piezoelectric film 123 of e.g. AlN and ZnO on the (111)-cut silicon substrate 110.

According to the present invention, the first electrode may be composed of a single conductive layer or multiple conductive layers each of which is uniaxially oriented. In the latter case, the lowest conductive layer (the one held in direct contact with the silicon substrate 110) is preferably provided by (111)-uniaxially oriented Al or Cu.

Figure 9:
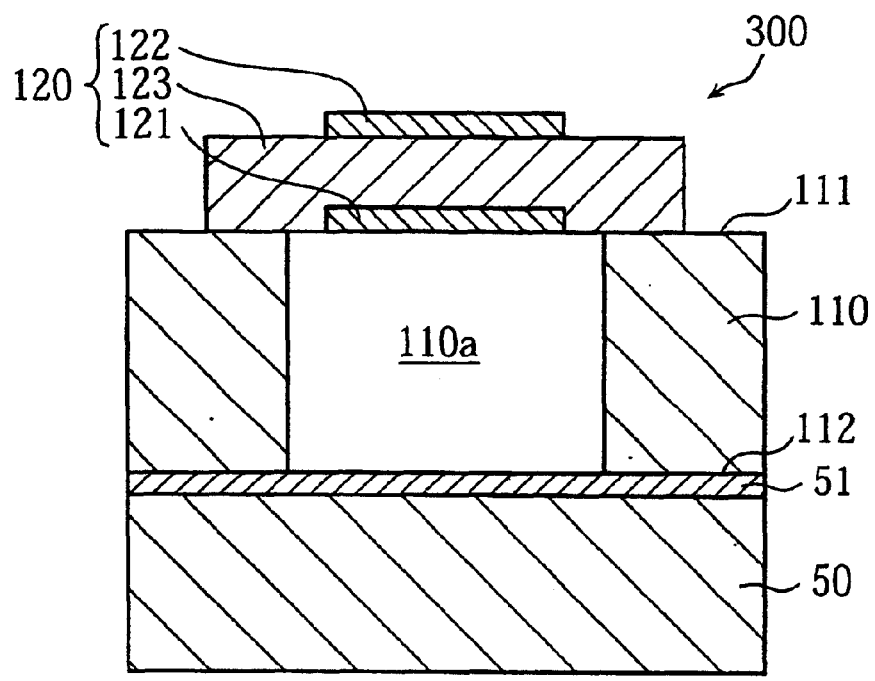
FIG. 9 is a sectional view of a thin-film piezo-resonator according to a third embodiment of the present invention.

FIG. 9 shows, in section, a thin-film piezo-resonator according to a third embodiment of the present invention. The illustrated piezo-resonator 300 includes a piezo-resonator 100 as shown in FIG. 2 and a 200 μm-thick cover substrate 50 attached to the resonator 100 so as to close the cavity 110a. More specifically, the cover substrate 50 has an upper surface formed with a Au—Sn film 51 as a bonding layer. The Au—Sn film 51 has a thickness of 5 μm and is produced by sputtering for example. The cover substrate 50 is attached to the second surface 112 of the silicon substrate 110 via the Au—Sn film 51. The silicon substrate 110 and the cover substrate 50 will be secured to each other after they are heated up and kept at about 310° C. for 30 minutes.

The cover substrate structure described above protects the resonator assembly 120 from being damaged through the resonator fabrication process. For instance, when the second surface 112 is to be bonded to a motherboard with conductive paste, the cover substrate 50 prevents the paste from penetrating into the cavity 110a. Also, the cover substrate 50 keeps the first electrode 121 or piezoelectric film 123 from being damaged when the resonator 300 is sucked up by a suction collet for performing flip chip bonding.

According to the present invention, the bonding material may not necessarily be Au—Sn film. A different kind of metal material or resin material (such as epoxy) may be used. Further, without relying on a bonding paste, direct bonding or anodic bonding may be employed for fixing the cover substrate 50 to the silicon substrate 110.

Figure 10:
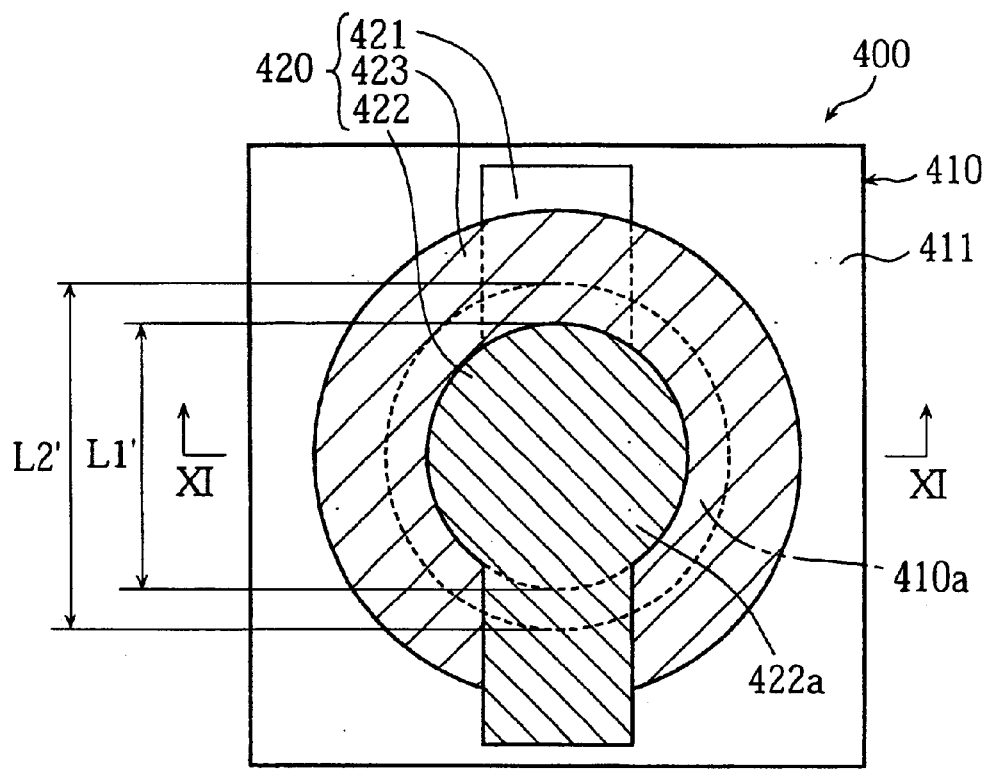
FIG. 10 is a plan view showing a thin-film piezo-resonator according to a fourth embodiment of the present invention.
Figure 11:
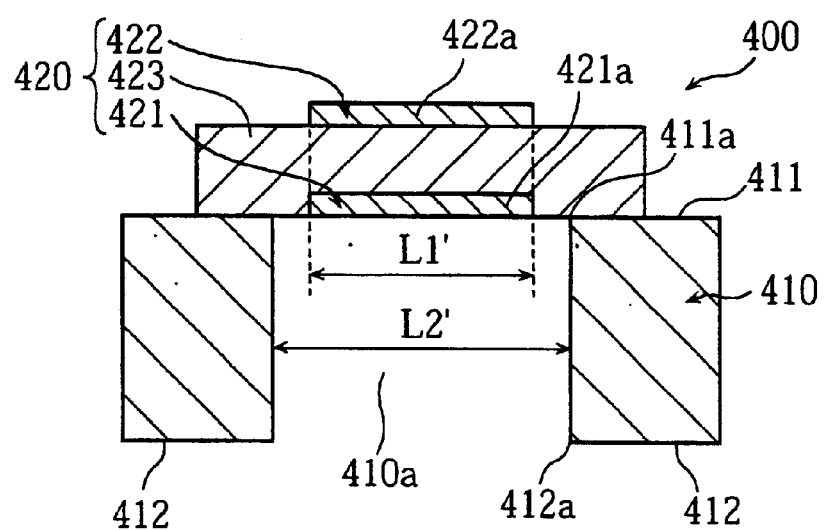
FIG. 11 is a sectional view taken along lines XI—XI in FIG. 10.

FIGS. 10 and 11 show a thin-film piezoelectric resonator 400 according to a fourth embodiment of the present invention. FIG. 10 is a plan view, while FIG. 11 is a sectional view taken along lines XI—XI.

The resonator 400 includes a silicon substrate 410 and a resonator assembly 420 formed on the substrate. The substrate 410 is a (111)-cut monocrystal silicon substrate and includes a first surface 411 and a second surface 412 both of which are a (111) surface. The resonator assembly 420 is composed of a first electrode 421, a second electrode 422 and a piezoelectric film 423 disposed between these electrodes. The first and the second electrodes 421, 422 include circular electrode portions 421a and 422a, respectively. As seen from FIG. 11, the circular electrode portions 421a, 422a are of the same size and aligned vertically, with the piezoelectric film 423 intervening therebetween. The combination of the electrode portions 421a and 422a serves as the exciter of the resonator 400. In the illustrated example, the diameter L1' of the exciter is about 50 µm. The first electrode 421, the second electrode 422 and the piezoelectric film 423 of the fourth embodiment are identical in thickness and material to the counterparts of the resonator 100 according to the first embodiment.

Figure 20:
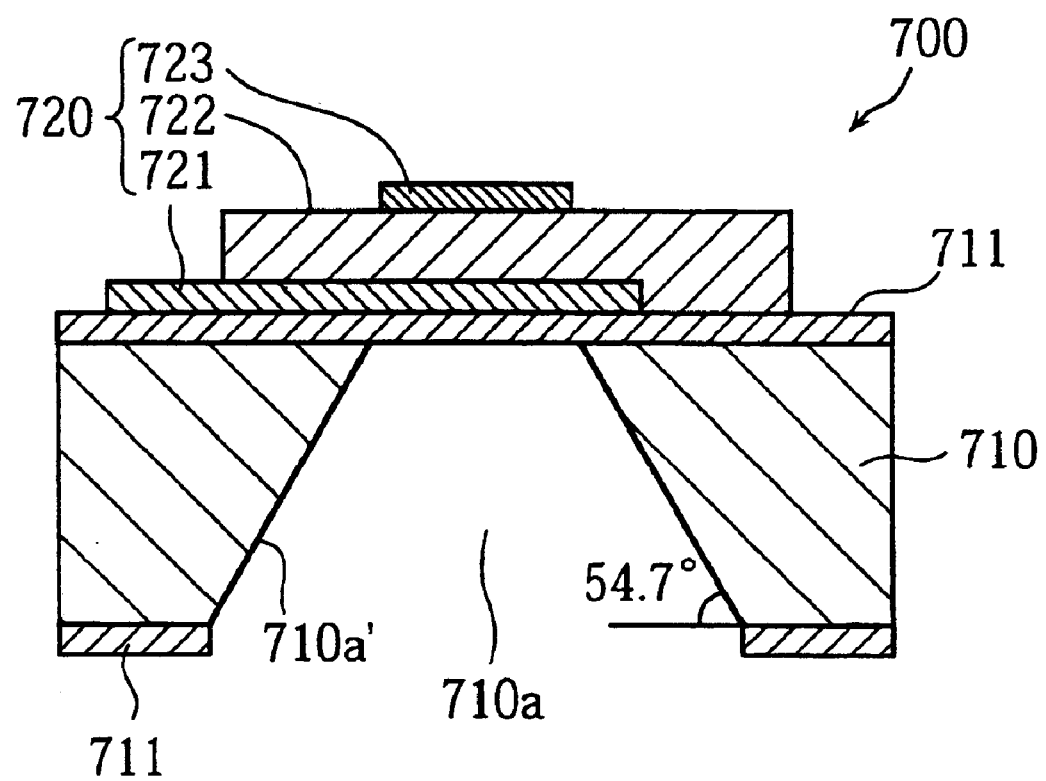
FIG. 20 is a sectional view of a conventional thin-film piezo-resonator.
Figure 21:
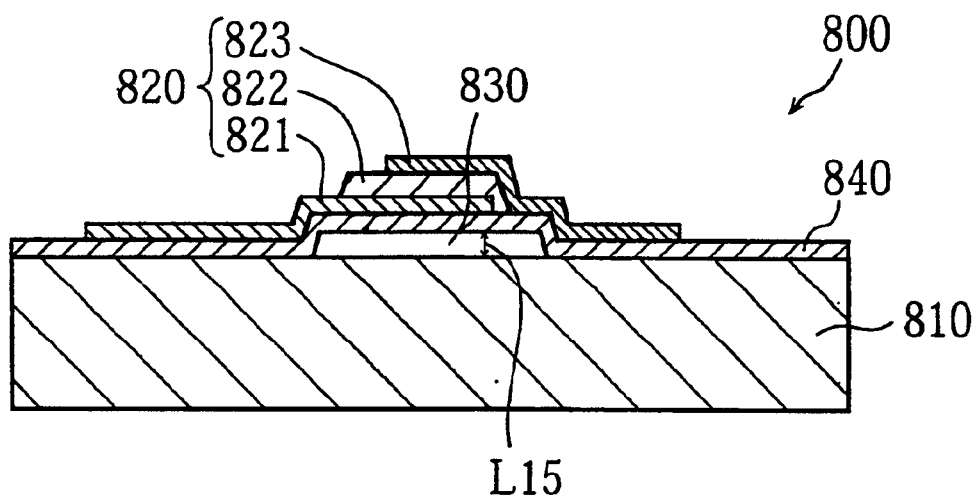
FIG. 21 is a sectional view of another conventional thin-film piezo-resonator.
Figure 22:
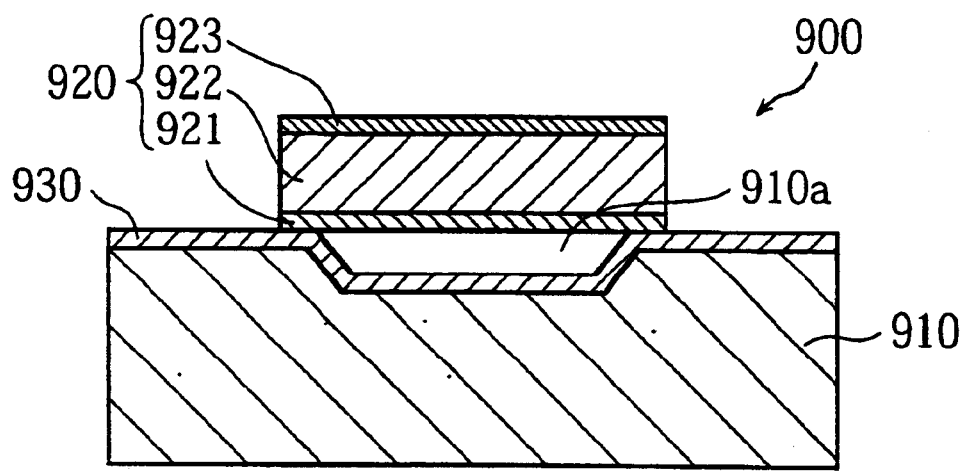
FIG. 22 is a sectional view of another conventional thin-film piezo-resonator.

The silicon substrate 410 is formed with a cavity 410a located immediately below the exciter of the resonator 420. The cavity 410a extends through the substrate 410 perpendicularly to the first and the second surfaces 411, 412. The cavity 410a has a first circular opening 411a opened in the first surface 411 and a second circular opening 412a opened in the second surface 412. In the illustrated example, the constant diameter L2' of the cavity 410a is about 60 µm. With this arrangement, the resonator 400 can be made compact since the second opening 412a is not larger than the first opening 411a (cf. the conventional resonator 700 of FIG. 20). As shown in FIG. 11, the circular electrode portion 421a and the piezoelectric film 423 are exposed to the cavity 410a, which is advantageous to provide excellent resonance characteristics. The resonator 400 may be fabricated in the same manner as the resonator 100.

Figure 12:
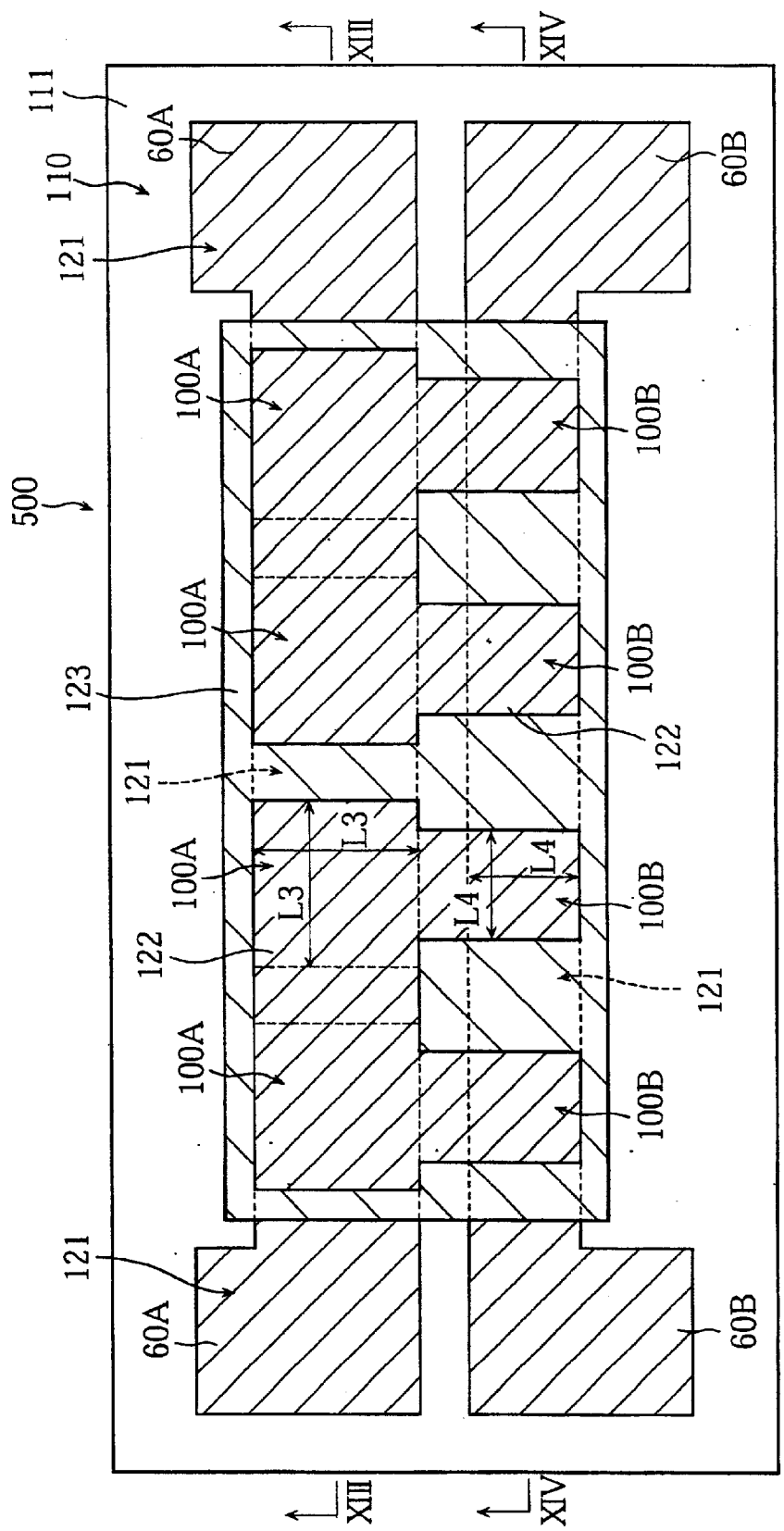
FIG. 12 is a plan view showing a band-pass filter according to a fifth embodiment of the present invention.
Figure 13:
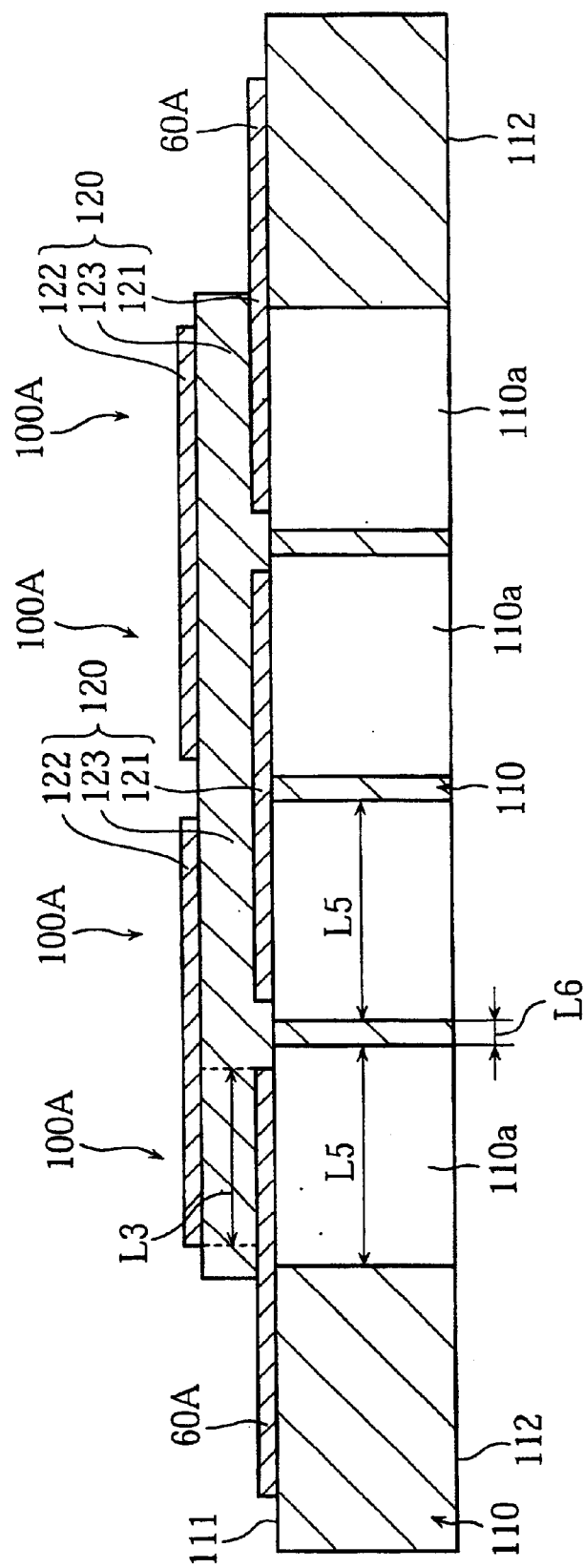
FIG. 13 is a sectional view taken along lines XIII—XIII in FIG. 12.
Figure 14:
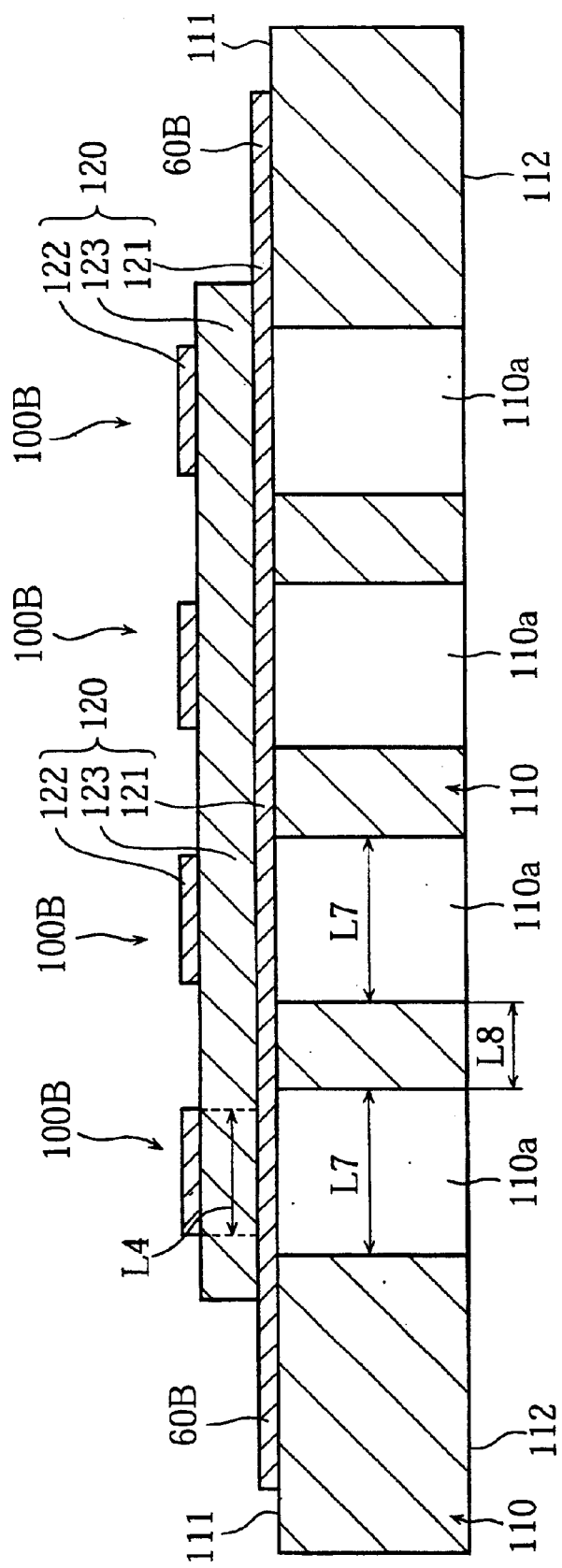
FIG. 14 is a sectional view taken along lines XIV—XIV in FIG. 12.

FIGS. 12~14 show a band-pass filter 500 according to a fifth embodiment of the present invention. FIG. 12 is a plan view, while FIG. 13 is a sectional view taken along lines XIII—XIII in FIG. 12, and FIG. 14 is a sectional view taken along lines XIV—XIV in FIG. 12.

Figure 19:
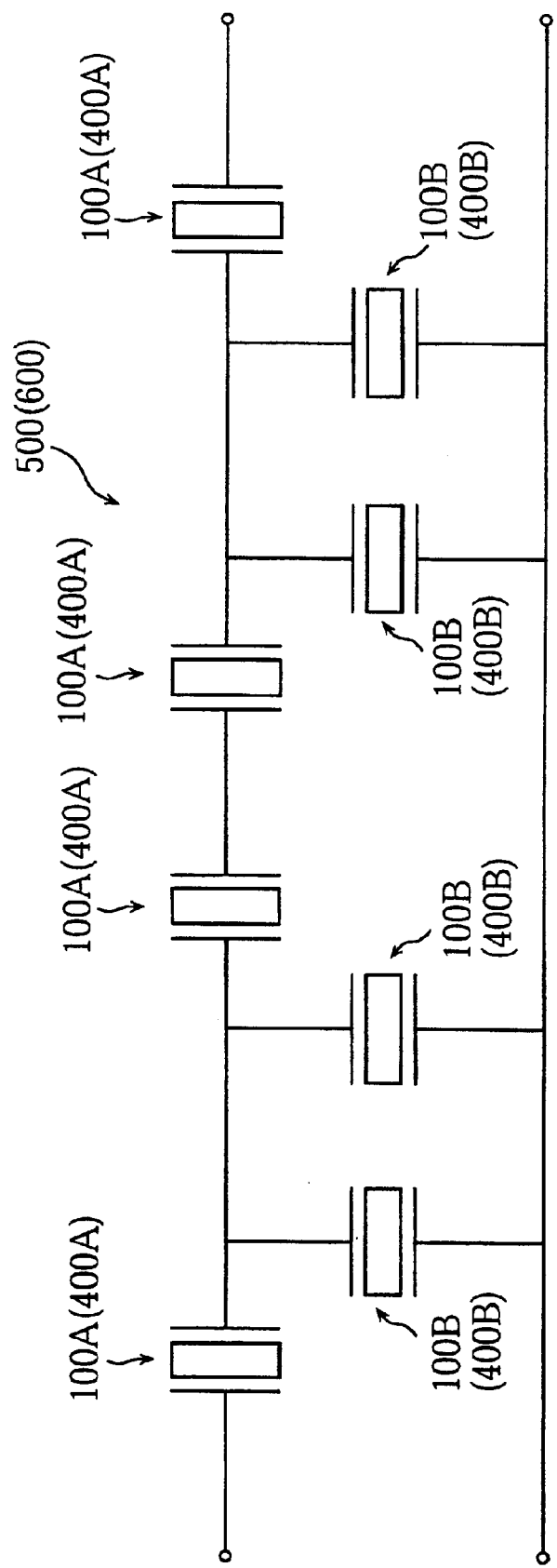
FIG. 19 is a circuit diagram of a band-pass filter of the present invention.

The band-pass filter 500 includes a silicon substrate 110 upon which are provided a first electrode pattern 121, a second electrode pattern 122 and a piezoelectric film 123 disposed between the first and the second electrode patterns. These three elements are so arranged as to form four thin-film piezoelectric resonators 100A (connected in series) and four thin-film piezoelectric resonators 100B (connected in parallel). Each of the resonators 100A and 100B corresponds to the resonator 100 of the first embodiment. For connection to an external device, circuit, etc., the first electrode pattern 121 includes a pair of exposed terminal portions 60A and another pair of exposed terminal portions 60B. In order to make the resonance frequency of the serial resonators 100A significantly different from that of the parallel resonators 100B, the parallel resonators 100B may be covered with a 50 nm-thick aluminum layer formed on the second electrode pattern 122. The band-pass filter 500 is a ladder type filter in which eight thin-film piezoelectric resonators 100A, 100B are integrally provided on a single silicon substrate 110. FIG. 19 is a circuit diagram of the band-pass filter 500.

As shown in FIG. 12, each resonator 100A has a square exciter whose side length L3 is 75 µm. The corresponding cavity 110a, as shown in FIG. 13, has a square opening whose side length L5 is 80 µm. The clearance L6 between the cavities 110a of the adjacent resonators 100A is 20 µm. In the resonator 100B, the side length L4 of the square exciter is 50 µm. The corresponding cavity 110a, as shown in FIG. 14, has a square opening whose side length L7 is 55 µm. The clearance L8 between the cavities 110a of the adjacent resonators 100B is 45 µm. In the band-pass filter 500, each cavity 110a corresponds in position to the exciter of a resonator 100A or 100B, wile also extending perpendicularly to the first surface 111 of the substrate 110. Accordingly, the respective resonator assemblies 120 (and hence the resonators 100A, 100B) can be disposed closer to each other than is conventionally possible, which is advantageous to making the band-pass filter compact. Further, the close arrangement of the resonator assemblies 120 advantageously reduces the resistance of the wiring pattern between them.

As shown in FIG. 13, the first electrode pattern 121 and the piezoelectric film 123 for each resonator 100A are partially exposed to the corresponding cavity 110a. This holds for each of the parallel resonators 100B. Such exposure ensures excellent resonance characteristics for the respective resonators 100A, 100B. Accordingly, the band-pass filter 500 also has excellent resonance characteristics. The band-pass filter 500 may be fabricated in substantially the same manner as the resonator 100 of the first embodiment. More precisely, the fabrication method of the resonator 100 may be modified in a manner obvious to the person skilled in the art so that the predetermined number of resonators 100 will be integrally formed on the same substrate.

In accordance with the present invention, the first electrode pattern may be a laminate of a 50 nm-thick aluminum layer and a 100 nm-thick molybdenum layer, while the second electrode pattern may be a single, 100 nm-thick molybdenum layer, as in the resonator 200 of the second embodiment (FIG. 8). Further, as in the resonator 300 of the third embodiment (FIG. 9), a cover substrate may be attached to the substrate 110 from below.

Figure 15:
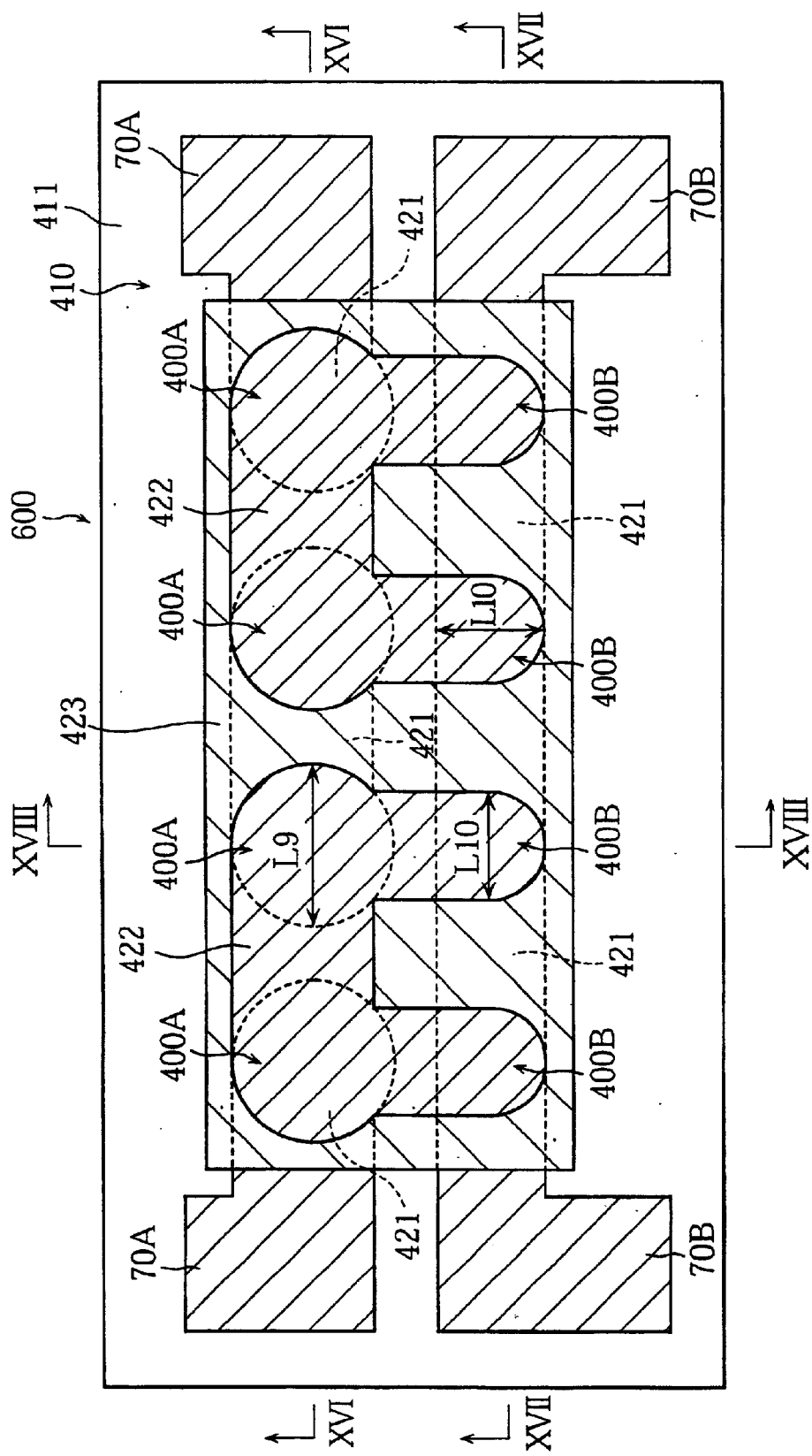
FIG. 15 is a plan view showing a band-pass filter according to a sixth embodiment of the present invention.
Figure 16:
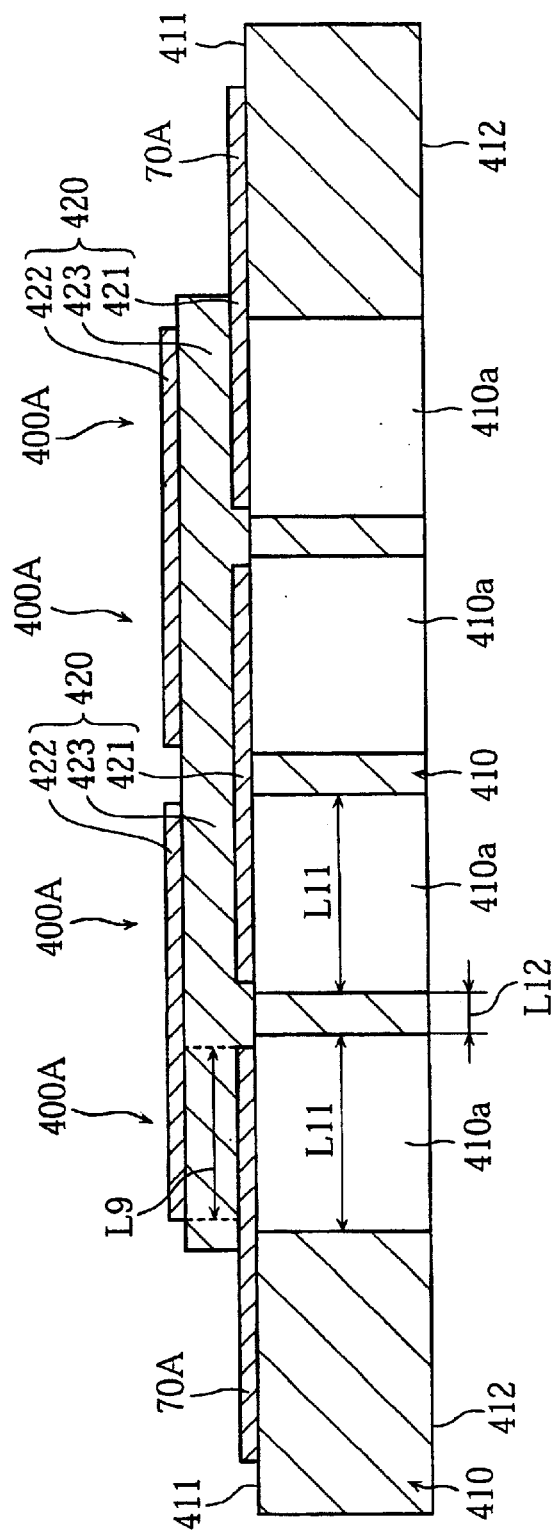
FIG. 16 is a sectional view taken along lines XVI—XVI in FIG. 15.
Figure 17:
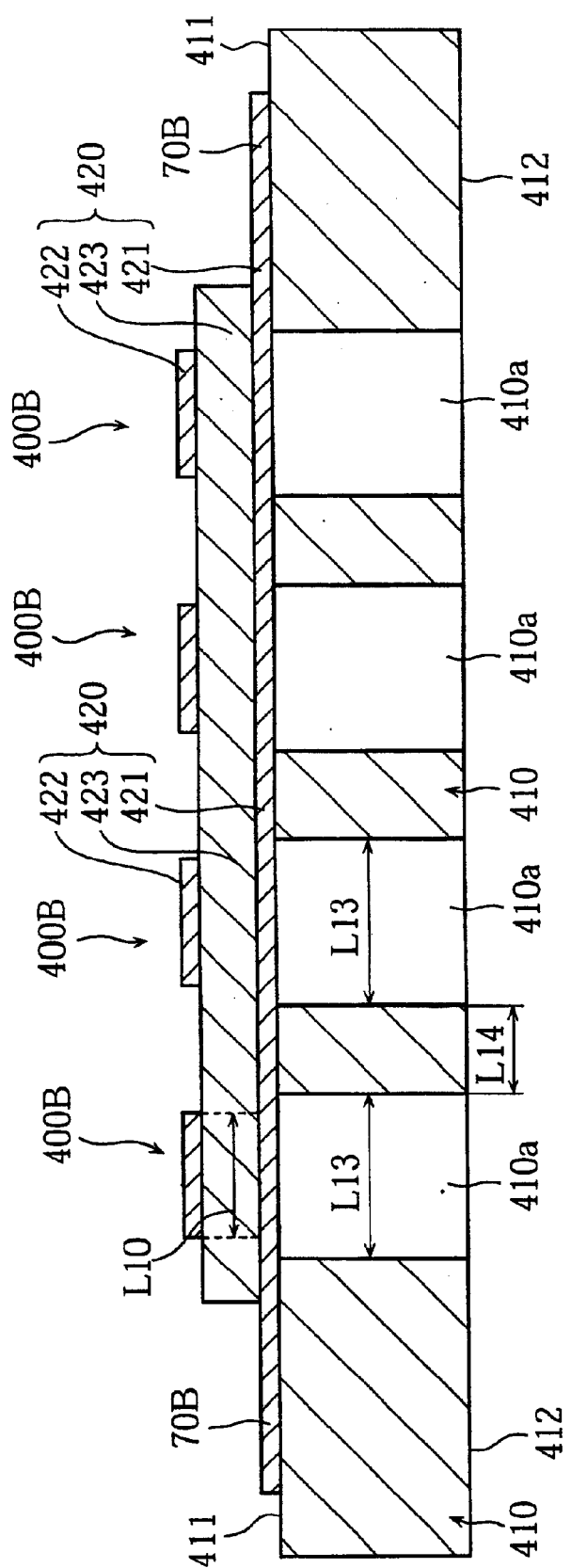
FIG. 17 is a sectional view taken along lines XVII—XVII in FIG. 15.
Figure 18:
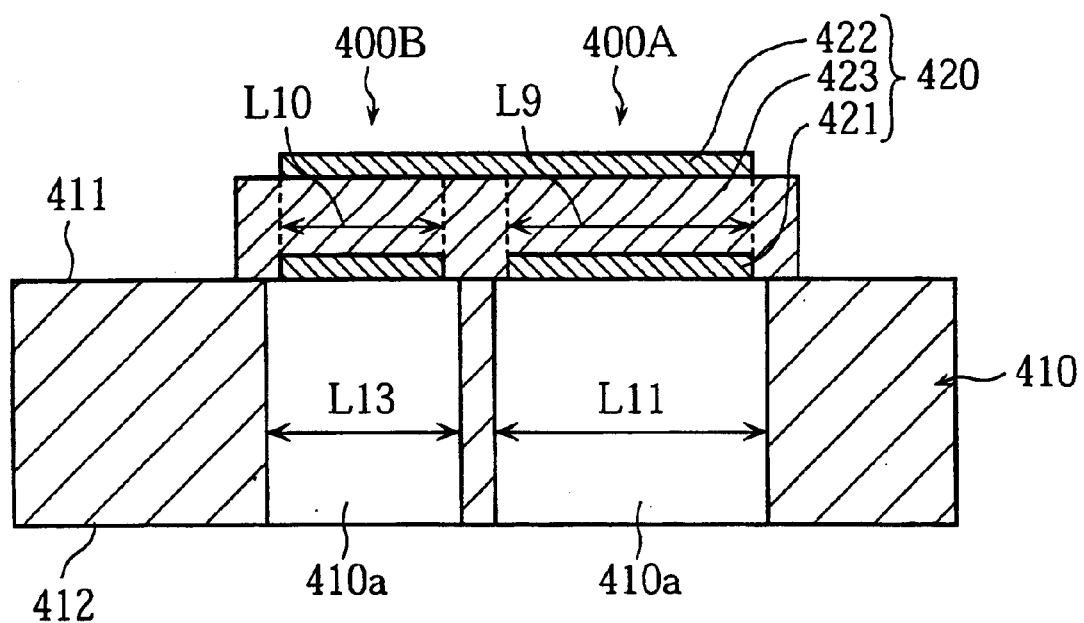
FIG. 18 is a sectional view taken along lines XVIII—XVIII in FIG. 15.

FIGS. 15~18 show a band-pass filter 600 according to a sixth embodiment of the present invention. FIG. 15 is a plan view, while FIGS. 16, 17 and 18 are a sectional view taken along lines XVI—XVI, XVII—XVII and XVIII—XVIII in FIG. 15, respectively.

The band-pass filter 600 includes a silicon substrate 410 upon which are provided a first electrode pattern 421, a second electrode pattern 422 and a piezoelectric film 423 disposed between these electrode patterns. As in the fifth embodiment described above, the electrode patterns 421, 422 and the piezoelectric film 423 are arranged to produce four serially-connected resonators 400A and four parallel resonators 400B. Each of the resonators 400A and 400B corresponds to the resonator 400 of the fourth embodiment (FIGS. 10 and 11). For connection to an external device, a circuit, etc., the first electrode pattern 421 includes a pair of terminal portions 70A and another pair of terminal portions 70B. As in the previous embodiment, preferably the parallel resonators 400B are covered with a 50 nm-thick aluminum layer (formed on the second electrode pattern 422) for significantly differentiating the resonance frequency of the serial resonators 400A from that of the parallel resonators 400B. The band-pass filter 600 is a ladder type filter in which eight thin-film piezoelectric resonators 400A, 400B are integrally provided on a single silicon substrate 410. The band-pass filter 600 is also represented by the circuit diagram shown in FIG. 19.

The diameter L9 (FIG. 15) of the circular exciter of the resonator 400A is 85 µm, while the diameter L11 (FIG. 16) of the opening of the corresponding cavity 410a is 90 µm. The distance L12 (FIG. 16) between the cavities 410a of the adjacent resonators 400A is 20 µm. The length L10 (FIG. 15) of the exciter of the resonator 400B is 55 µm. As shown in FIGS. 17 and 18, the diameter L13 of the opening of the corresponding cavity 410a is 60 µm. The distance L14 (FIG. 17) between the cavities 410a of the adjacent resonators 400B is 50 µm. As in the previous embodiment, the band-pass filter 600 can be made compact by disposing the resonator assemblies 420 close to each other.

As shown in FIGS. 16 and 17, the first electrode pattern 421 and the piezoelectric film 423 for each resonator 400A or 400B are partially exposed to the corresponding cavity 410a. Such exposure ensures excellent resonance characteristics for the respective resonators 400A, 400B.

Accordingly, the band-pass filter 600 also has excellent resonance characteristics. The band-pass filter 600 may be fabricated in substantially the same manner as the resonator 100 of the first embodiment. More precisely, the fabrication method of the resonator 100 may be modified in a manner obvious to the person skilled in the art so that the predetermined number of resonators 400 will be integrally formed on the same substrate.

In accordance with the present invention, the first electrode pattern may be a laminate of a 50 nm-thick aluminum layer and a 100 nm-thick molybdenum layer, while the second electrode pattern may be a single, 100 nm-thick molybdenum layer, as in the resonator 200 of the second embodiment (FIG. 8). Further, as in the resonator 300 of the third embodiment (FIG. 9), a cover substrate may be attached to the substrate 410 from below. The exciter may be elliptical or oval rather than circular.

The fifth and sixth embodiments relate to band-pass filters, as described above. It should be noted that the thin-film piezoelectric resonators of the present invention can be used for providing a high-pass filter or low-pass filter.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A thin-film piezo-resonator comprising:
    a substrate having a first surface and a second surface opposite to said first surface, the substrate being formed with a non-filled cavity that has a first opening in said first surface and a second opening in said second surface; and
    a resonator assembly including an exciter composed of a first electrode contacting said first surface, a piezoelectric layer on the first electrode and a second electrode on the piezoelectric layer, the assembly being disposed at a location corresponding to the cavity;
    wherein the cavity is located immediately under the resonator assembly and has a side surface extending in a substantially perpendicular direction to the first surface.

2. The resonator according to claim 1, wherein the first electrode comprises a uniaxially oriented single-layer conductive member or uniaxially oriented multi-layer conductive member.

3. The resonator according to claim 2, wherein the piezoelectric layer is uniaxially oriented.

4. The resonator according to claim 1, wherein the substrate is a (111)-cut silicon substrate, said first surface and said second surface each being a (111) surface.

5. The resonator according to claim 4, wherein the first electrode comprises a single conductive layer containing either one of (111)-uniaxially oriented Al and (111)-uniaxially oriented Cu.

6. The resonator according to claim 4, wherein the first electrode comprises a stack of uniaxially oriented conductive layers including a first conductive layer held in contact with said first surface, the first conductive layer containing either one of (111)-uniaxially oriented Al and (111)-uniaxially oriented Cu.

7. The resonator according to claim 4, wherein the first electrode has a two-layer structure comprising a first conductive layer and a second conductive layer, the first conductive layer held in contact with said first surface and containing either one of (111)-uniaxially oriented Al and (111)-uniaxially oriented Cu, the second conductive layer containing (110)-uniaxially oriented Mo.

8. The resonator according to claim 4, wherein the piezoelectric layer is made of either one of (002)-uniaxially oriented AlN and (002)-uniaxially oriented ZnO.

9. The resonator according to claim 1, further comprising a cover substrate bonded to said second surface of the substrate so as to close the cavity.

10. The resonator according to claim 1, wherein each of the first and the second openings has a circular or oval configuration.

11. A thin-film piezo-resonator comprising:
    a substrate having a first surface and a second surface opposite to said first surface, the substrate being formed with a cavity that has a first opening in said first surface and a second opening in said second surface; and
    a resonator assembly including an exciter composed of a first electrode contacting said first surface, a piezoelectric layer on the first electrode and a second electrode on the piezoelectric layer, the assembly being disposed at a location corresponding to the cavity;
    wherein the cavity includes a side surface extending in a substantially perpendicular direction to said first surface; and
    wherein each of the first electrode and the piezoelectric layer includes a portion exposed to the cavity.

12. The resonator according to claim 11, wherein the exposed portion of the first electrode and the exposed portion of the piezoelectric layer are made of a material which is not etched by a fluorine gas.

13. A thin-film piezo-resonator comprising:
    a (111)-cut silicon substrate;
    a first electrode formed on the substrate and containing either one of Al and Cu;
    a piezoelectric layer formed on the first electrode and containing either one of AlN and ZnO; and
    a second electrode formed on the piezoelectric layer;
    wherein the silicon substrate includes a first surface which is a (111) surface, the first electrode being held in contact with said first surface.

14. A thin-film piezo-resonator comprising:
    a substrate having a first surface and a second surface opposite to said first surface, the substrate being formed with a cavity that has a first opening in said first surface; and
    a resonator assembly including a first electrode contacting said first surface, a piezoelectric layer on the first electrode and a second electrode on the piezoelectric layer, the assembly being disposed at a location corresponding to the cavity;
    wherein each of the first electrode and the piezoelectric layer includes a portion exposed to the cavity.

15. The resonator according to claim 14, wherein the first and the second electrodes comprise first and second exciter portions, respectively, that define the exciter, the first opening being greater in area than the exciter portions by a factor of 1~2.25.

16. The resonator according to claim 15, wherein the first exciter portion and the second exciter portion are substantially identical in shape.

17. The resonator according to claim 15, wherein each of the first and the second exciter portions is at least partially circular or oval.

18. A filter comprising:

a substrate having a first surface and a second surface opposite to said first surface, the substrate being formed with a plurality of non-filled cavities spaced from each other;

a first electrode pattern held in contact with said first surface;

a piezoelectric layer on the first electrode pattern;

a second electrode pattern on the piezoelectric layer; and a plurality of resonator assemblies provided by a combination of the first electrode pattern, the piezoelectric layer and the second electrode pattern, each of the resonator assemblies corresponding in position to one of the cavities;

wherein each of the cavities is located immediately under a corresponding one of the resonator assemblies and has a side surface extending in a substantially perpendicular direction to said first surface.

19. The filter according to claim 18, wherein each of the cavities includes a first opening in said first surface and a second opening in said second surface, a distance between adjoining first openings being no greater than 420 μm.

20. The filter according to claim 18, wherein said plurality of resonator assemblies include a first group of resonator assemblies connected in series and a second group of resonator assemblies connected in parallel.

21. The filter according to claim 18, wherein the first electrode pattern and the piezoelectric layer are exposed to one of the cavities.

22. A filter comprising:

a substrate having a first surface and a second surface opposite to said first surface, the substrate being formed with a plurality of cavities each including a first opening in said first surface and a second opening in said second surface;

a first electrode pattern held in contact with said first surface;

a piezoelectric layer on the first electrode pattern;

a second electrode pattern on the piezoelectric layer; and a plurality of exciters provided by a combination of the first electrode pattern, the piezoelectric layer and the second electrode pattern, each of the exciters corresponding in position to one of the cavities;

wherein the first electrode pattern and the piezoelectric layer each include a portion exposed to one of the cavities.

23. The filter according to claim 22, wherein the exposed portions of the first electrode pattern and the piezoelectric layer are made of a material which is not etched by a fluorine gas.

24. The filter according to claim 22, wherein each of the exciters is defined by a first exciter portion and a second exciter portion contained respectively in the first electrode pattern and the second electrode pattern, the first exciter portion and the second exciter portion being substantially identical in shape.

25. The filter according to claim 24, wherein the first opening of the cavity corresponding to said each exciter is greater in area than the exciter portions by a factor of 1~2.25.

26. The filter according to claim 22, Wherein the first and the second openings of each cavity are circular or oval.

* * * * *